(12) United States Patent
Raab

(10) Patent No.: US 6,256,482 B1
(45) Date of Patent: Jul. 3, 2001

(54) POWER- CONSERVING DRIVE-MODULATION METHOD FOR ENVELOPE-ELIMINATION-AND-RESTORATION (EER) TRANSMITTERS

(76) Inventor: Frederick H. Raab, Green Mountain Radio Research Company, 50 Vermont Avenue, Colchester, VT (US) 05446

( * ) Notice: Subject to any disclaimer, the term of this patent is extended or adjusted under 35 U.S.C. 154(b) by 0 days.

(21) Appl. No.: 09/055,165

(22) Filed: Apr. 4, 1998

Related U.S. Application Data

(60) Provisional application No. 60/043,390, filed on Apr. 7, 1997.

(51) Int. Cl.[7] ............................................. H04B 1/04
(52) U.S. Cl. ........................ 455/108; 455/93; 455/102; 455/108; 455/127; 330/199; 330/200; 332/149; 332/159
(58) Field of Search ........................ 455/108, 93, 102, 455/127; 332/149, 159, 151; 330/200, 199, 136, 110

(56) References Cited

U.S. PATENT DOCUMENTS

| | | | |
|---|---|---|---|
| 4,199,723 | * | 4/1980 | Cummings et al. ............... 455/108 |
| 5,060,294 | * | 10/1991 | Schwent et al. ............... 455/93 |
| 5,175,877 | * | 12/1992 | Streeter ............... 455/102 |
| 5,239,693 | * | 8/1993 | Gailus et al. ............... 455/126 |
| 5,469,127 | * | 11/1995 | Hulick et al. ............... 332/149 |
| 5,524,285 | * | 6/1996 | Wray et al. ............... 455/126 |
| 5,771,442 | * | 6/1998 | Wang et al. ............... 455/102 |
| 5,929,702 | * | 7/1999 | Myers et al. ............... 330/10 |

* cited by examiner

Primary Examiner—Lee Nguyen
Assistant Examiner—Simon Nguyen
(74) Attorney, Agent, or Firm—Ted Touw

(57) ABSTRACT

A method and a circuit for high-efficiency linear RF-power amplification over a wide range of amplitudes from zero to peak output includes a final RF-power amplifier operating at or near saturation, an RF driver amplifier, a high-level amplitude modulator for the final amplifier, preferably a high-level amplitude modulator for the driver amplifier, and a means for determining the supply-voltage input to the final amplifier and for controlling the amplitude of the drive. The means for determining the supply-voltage input and for controlling the amplitude acts so that the final amplifier drive varies from a minimum level to peak as the desired transmitter output varies from zero to peak. The transmitter is preferably of the envelope-elimination-and-restoration type or the envelope-tracking type.

32 Claims, 13 Drawing Sheets

POWER- CONSERVING DRIVE-MODULATION METHOD FOR ENVELOPE-ELIMINATION-AND-RESTORATION (EER) TRANSMITTERS

This application is related to U.S. Provisional Patent Application Ser. No. 60/043,390, "Power-Conserving Drive-Modulation Method for Kahn-Technique (EER) Transmitter," filed on Apr. 7, 1997.

TECHNICAL FIELD

The present invention relates to the field of radio transmitters and radio-frequency or microwave power amplifiers and more specifically to methods of improving efficiency in Kahn envelope-elimination-and-restoration (EER) circuits and in high-level amplitude modulation circuits and to modified Kahn envelope-elimination-and-restoration circuits.

BACKGROUND ART

AM radio signals are used in a variety of applications, including broadcast, non-directional navigation beacons, citizens-band radios, and aircraft communication. Various other radio signals with more complex modulations have time-varying amplitudes (envelopes) and can be regarded as having simultaneous amplitude and phase modulation. Examples of complex modulations include Single Sideband (SSB), Independent Sideband (ISB), Vestigial Sideband (VSB), multitone data, multiple carriers amplified simultaneously, and modem shaped-pulse digital-data modulation. Variable-amplitude radio signals are also required in applications such as magnetic-resonance imaging (MRI) and industrial-scientific-medical (ISM) devices.

AM transmitters can be implemented by a variety of techniques (see H. L. Krauss, C. W. Bostian, and F. H. Raab, "Solid State Radio Engineering" Chapter 15, New York, Wiley, 1980), but high-level amplitude modulation is widely regarded as preferable for both quality and efficiency. In high-level amplitude modulation, the main DC supply-voltage input to the final RF power amplifier is varied in proportion to the desired signal amplitude. The RF amplifier is operated in or close to saturation (i.e., at the top of or above its linear operating region). The amplitude (envelope) of the RF output is thereby caused to vary with the supply-voltage input. Throughout this specification and the appended claims, the terminology "high-level modulation," "high-level modulator," etc. refers to such modulation of the main DC supply-voltage input to the final RF power amplifier. It is worth noting that the terms "drain bias" or "collector bias" are sometimes used to refer to a supply-voltage input, especially in microwave engineering. In the present specification and appended claims, the term "supply-voltage input" is meant to include these connection points and any other kind of connection at which the supply voltage enters an amplifier.

High-level amplitude modulation can be used with more complex signals such as SSB through the Kahn Envelope-Elimination-and-Restoration (EER) technique (see L. R. Kahn, "Single Sideband Transmission by Envelope Elimination and Restoration," Proc. IRE, vol. 40, no. 7, pp. 803–806, July 1952). In the classical form of a Kahn-technique transmitter, a limiter eliminates the envelope, producing a constant-amplitude, phase-modulated carrier which becomes the drive to the final amplifier. The detected envelope is amplified by an audio-frequency power amplifier. Amplitude modulation of the final RF power amplifier restores the envelope to the phase-modulated carrier, creating an amplified replica of the input signal. In a modern implementation, the envelope and phase-modulated carrier are produced by a combination of digital signal processing and synthesis.

High efficiency is needed for a variety of reasons. In high-power broadcast transmitters, efficiency determines the consumption of prime AC power and therefore the operating cost. In space-borne and portable transmitters, efficiency determines the size of the battery, power supply, and heat sink. Hence, highly efficient transmitters can be made much smaller and lighter than conventional transmitters. In all cases, improving efficiency reduces the heat dissipated in the RF-power devices, and the resultant lower temperatures increase reliability.

Efficiency can be improved by using a high-efficiency RF power amplifier, a high-efficiency modulator, and a technique such as Kahn EER. However, a limitation on efficiency for low signal levels remains. Often, transmitters must produce low-amplitude signals for a significant portion of the time; hence the efficiency in producing these signals dominates the overall average efficiency.

Drive power is a significant contributor to inefficiency when the transmitter is producing a low-level output. It is well known that the drive (for ideal power amplifiers) can be made to vary with the envelope of the output signal. However, in most real RF-power devices, the gain decreases at lower supply-voltage inputs, which causes them to cease amplification. Furthermore, efficient modulators such as class S modulators work best with fixed, known loads and behave erratically if their load (the RF power amplifier) ceases to draw current.

A detailed discussion of the impact of signal characteristics upon the average efficiency of power amplifiers is given by F. H. Raab, "Average Efficiency of Power Amplifiers," Proc. RF TECHNOLOGY EXPO '86, Anaheim, Calif., pp. 474–486, Jan. 30–Feb. 1, 1986. The instantaneous efficiency (See FIG. 1) of an ideal class-A power amplifier increases with the square of its output voltage, reaching 50 percent at peak-envelope-power (PEP) output. The efficiency of an ideal class-B power amplifier increases linearly with the output voltage to 78.5 percent ($=\pi/4$) at PEP (see H. L. Krauss, C. W. Bostian, and F. H. Raab, "Solid State Radio Engineering," Chapter 12, New York, Wiley, 1980). In practice, losses in MOSFETs due to resistance reduce the efficiency by 10 to 20 percent, resulting in maximum instantaneous efficiencies of about 40 and 60 percent for class-A and -B power amplifiers, respectively. The presence of load reactance degrades the efficiency even further.

The efficiency of switching-mode power amplifiers (classes D, E, and F) as well as class-C power amplifiers is generally higher than that of a linear power amplifier (class A or B). Because variation of the output amplitude is achieved through variation of the DC supply voltage, the instantaneous efficiency of these power amplifiers remains high for all signal levels. Given proper drive, the efficiency of a class-D power amplifier is subjected to only minor degradation by a reactive load.

Class-D power amplifiers typically achieve Peak Envelope Power (PEP) efficiencies from 75 to 90 percent. For power amplifiers that use Bipolar Junction Transistors (BJTs), the efficiency decreases at lower signal amplitudes because the BJT saturation voltage becomes a more significant fraction of the supply-voltage input. However, for power amplifiers that use MOSFETs, the instantaneous efficiency is largely independent of the output voltage.

Saturated power amplifiers of any class generally maintain relatively constant efficiency near the value for peak output.

Continuous Wave (CW) and Frequency Modulation (FM) signals are characterized by constant envelopes and therefore are always at PEP. In contrast, SSB-voice, multitone-data, noise, and shaped-pulse data signals have time-varying envelopes with significant peak-to-average ratios ξ (typically 6–10 dB).

The probability-density functions (PDFs) of FIG. 2 represent the relative amounts of time that the envelope spends in the vicinity of the corresponding output voltage. The Rayleigh PDF is produced by noise or a multitone signal, while the Laplacian PDF is produced by SSB speech. The PDF of square-root raised-cosine offset quadrature-amplitude modulation (SRRC DQAM in FIG. 2) is typical of that of most modern shaped-pulse digital modulations (See L. Sundstrom, "The Effect Of Quantization In A Digital Signal Component Separator For LINC Transmitters," IEEE Trans. Veh. Technol., vol. 45, no. 2, pp. 346–352, May 1996).

Upon comparison of the instantaneous-efficiency and PDF curves in FIG. 2, it is immediately apparent that the instantaneous efficiencies differ greatly at the signal amplitudes that are most prevalent in real amplitude-modulated signals. To compare different amplifiers with different signals, it is useful to define the average efficiency as $$\eta_{AVG} = \frac{P_{oAVG}}{P_{iAVG}}$$

where $P_{oAVG}$ and $P_{iAVG}$ are the average power output and input, respectively.

The average-efficiency characteristics for ideal class-A and -B power amplifiers may be evaluated for a variety of commonly used signals. For a Rayleigh envelope with ξ=10 dB, the average efficiencies of class-A and -B power amplifiers are only 5 percent and 28 percent, respectively.

Operation of transmitters at less than full power is required for a variety of purposes such as reducing interference and reducing power consumption. Such operation in back-off shifts the PDF curves leftward in FIG. 2 and causes conventional power amplifiers to be even less efficient.

The RF-power amplifiers discussed may employ one or more RF-power devices. RF-power devices, including vacuum tubes, BJTs, MOSFETs, MESFETs, HBTs, HEMTs, HFETs, and pHEMTs, and new devices are continually being developed. Different devices are preferred for different frequencies, power levels, and classes of operation.

The transmitter architecture and types of power amplifier that can be used depend upon the type of signal to be amplified.

FIG. 3 shows the amplifier schematic for a conventional linear architecture transmitter. For the amplifier shown in FIG. 3, the signal becomes progressively larger in each stage of amplification. RF input 10 is coupled to driver amplifier 12 which is coupled to final amplifier 14 which in turn is coupled to RF output 16. Amplifiers 12 and 14 may comprise any type of amplifier, such as class A, B, C, D, E, or F amplifiers. Input signal 13 is applied to RF input 10. Driver 12 produces intermediate signal 15 and final amplifier 14 produces output signal 17 on RF output 16. This type of amplifier can be used to produce both wideband (e.g., audio, pulses, multiple carriers) and narrowband signals (e.g., SSB, TV, FDM, data with shaped envelope). Here, the terms "narrowband" and "wideband" are being used, not to refer to the actual absolute bandwidths of the signals, but in a relative sense. Thus, "narrowband" is used to mean an RF signal whose bandwidth is small (say one-half or less) of its center or carrier frequency; "wideband" is used to refer to other signals that are not so easily characterized as modulation of a carrier. Included in the "linear architecture" category are mildly nonlinear amplifiers that are linearized by techniques such as pre-distortion or feedback so that overall they function as linear amplifiers. Because the linear power amplifiers are inefficient for low-level signals, linear transmitters are inherently inefficient for signals with time-varying envelopes.

Traditional CW, FM, Frequency-Shift Keying (FSK), and Phase-Shift Keying (PSK) signals have constant envelopes and therefore can be produced by nonlinear amplifiers that offer higher efficiency. FIG. 4 shows the amplifier schematic for a conventional nonlinear architecture transmitter. For the amplifier shown in FIG. 4, the signal becomes progressively larger in each stage of amplification. RF input 20 is coupled to driver amplifier 22 which is coupled to final amplifier 24 which in turn is coupled to RF output 26. Amplifiers 22 and 24 may comprise any type of amplifier, such as class A, B, C, D, E, or F amplifiers. Input signal 23 is applied to RF input 20. Driver 22 produces intermediate signal 25 and final amplifier 24 produces output signal 27 on RF output 26. Nonlinear transmitter architectures require output filters; hence, nonlinear transmitter architectures are best suited for narrowband signals.

Amplitude-modulated signals are preferentially produced by the conventional high-level modulation technique shown in FIG. 5. Adder circuit 31 having audio frequency input 29A and carrier level input 29B is coupled to high power amplifier 32 which is connected to the supply-voltage input of RF-power amplifier 37. RF-power amplifier 37 has RF input 36 for receiving RF input signal 34 and has RF output 38. Audio frequency signal 30A is superimposed on carrier signal 30B by adder circuit 31 to set the carrier level for amplifier 32. The output of amplifier 32 is voltage signal 33 in response to which amplifier 37 converts input RF signal 34 to output RF signal 39 which is presented at RF output 38. Amplifier 32 may be a class S amplifier. This architecture is, however, incapable of producing complex signals such as SSB.

The conventional Kahn-technique transmitter architecture, shown in its simplest form in FIG. 6, is based upon the representation of a narrowband signal as simultaneous amplitude and phase modulation. RF input 40 is coupled to envelope detector 41 and limiter 43. Envelope detector 41 is coupled to amplitude modulator 42 the output of which is connected to the supply-voltage input of RF amplifier 44. The output of limiter 43 is coupled to RF amplifier 44, RF amplifier 44 having RF output 45. Input RF signal 46 is received at RF input 40 and converted to phase-modulated RF carrier signal 43A by limiter 43 and simultaneously converted to audio-like envelope signal 41A by envelope detector 41. Envelope signal 41A is applied to amplitude modulator 42. The output of amplifier 42 (amplitude modulator) is voltage signal 42A in response to which RF amplifier 44 converts phase-modulated carrier signal 43A to RF output signal 48, which is presented at RF output terminal 45. RF output signal 48 is an amplified replica of the original signal RF input signal 46. Amplifier 42 may be a class S amplifier. This architecture can produce complex signals and allows the use of efficient but nonlinear RF power amplifiers (classes C, D, E, or F) and the use of efficient modulators (classes G or S) in place of less efficient linear RF power amplifiers and modulators. When the RF bandwidth exceeds the capabilities of an efficient modulator, the Meinzer split-band technique can be used to obtain larger bandwidths with efficiency that is larger than that of a linear modulator (see K. Meinzer, "A Linear Transponder For Amateur Radio Satellites," VHF Communications, vol. 7, pp. 42–57, January 1975).

A conventional Kahn-technique transmitter employing an analog signal source and frequency translation is shown in FIG. 7. Audio frequency input 50 is coupled to SSB modulator 51. The output of SSB modulator 51 is coupled to both envelope detector 52 and delay module 55. Optionally, delay module 55 may be placed after limiter 56, or anywhere else in the RF path ahead of final amplifier 61. Envelope detector 52 is coupled to amplifier 53 having supply-voltage input 64. Amplifier 53 is coupled to first filter 54. First filter 54 is connected to the supply-voltage input of final amplifier 61. Delay module 55 is coupled to limiter 56 which is coupled to second filter 59 through mixer 57. Frequency source (LO) 58 is also coupled to mixer 57. Second filter 59 is coupled to driver 60 having supply-voltage input 64, and driver 60 in turn is coupled to final amplifier 61. Final amplifier is coupled to third filter 62 having an RF output 63. Amplifier 53 may be a class S amplifier and amplifiers 60 and 61 may be class D amplifiers. Filter 54 may be a low-pass filter and filters 59 and 62 may be bandpass filters. Limiting and envelope detection are accomplished at a conveniently low intermediate frequency to obtain high linearity and low amplitude-to-phase conversion. The frequency-conversion process is the same as that in other transmitters, and multiple stages of frequency conversion may be used to ensure low levels of spurious products. Delay module 55 matches the delay of the phase-modulated information to the delay introduced in the amplitude modulator.

High efficiency can be achieved by using nonlinear but efficient power amplifiers in place of the linear power amplifiers used in other architectures. Nonlinear RF power amplifiers, including classes C, D, E, and F, offer better efficiency than do linear power amplifiers (classes A and B). Linear power amplifiers can also be operated at or near saturation to obtain their maximum possible efficiency. High-efficiency high-level amplitude modulation is accomplished by class-S, class-G, or pulse-step-modulated audio frequency power amplifiers. (Hybrid combinations, such as combining a class-S with a linear amplifier, e.g. class A or B, could also be used.) Class-S amplifiers are basically similar in operation to switching-type voltage regulators or "buck" converters.

While conventional linear transmitters suffer from poor efficiency for low-amplitude signals, Kahn-technique transmitters have good efficiency over a wide dynamic range.

A Kahn-technique transmitter that operates at High Frequency (HF) and Very High Frequency (VHF) and employs a class-D RF power amplifier and a class-S modulator is described by the inventor in papers by F. H. Raab and D. J. Rupp, "High-Efficiency Single-Sideband HF/VHF Transmitter Based Upon Envelope Elimination And Restoration," Proc. Sixth Int. Conf. HF Radio Systems and Techniques (HF '94) (IEE CP 392), York, UK, pp. 21–25, Jul. 4–7, 1994, and by F. H. Raab and D. J. Rupp, "High-efficiency Multimode HF/VHF Transmitter for Communication and Jamming," Proc. MILCOM '94, Ft. Monmouth, N.J., pp. 880–884, Oct. 2–5, 1994. Its RF-power amplifier is described in the paper by F. H. Raab and D. J. Rupp, "HF Power Amplifier Operates In Both Class B And Class D," Proc. RF EXPO WEST '93, San Jose, Calif., pp. 114–124, Mar. 17–19, 1993. Its modulator is described in the paper by F. H. Raab and D. J. Rupp, "Class-S High-Efficiency Amplitude Modulator," RF DESIGN, vol. 17, no. 5, pp. 70–74, May 1994 and in the paper by F. H. Raab and D. J. Rupp, "High-Efficiency Amplitude Modulator," Proc. RF EXPO EAST '94, Orlando, Fla., pp. 1–9, Nov. 15–17, 1994. It is expected that an L-band Kahn-technique transmitter that uses a conventional power amplifier operated in saturation will be described in a presentation by F. H. Raab, B. E. Sigmon, R. G. Myers, and R. M. Jackson, "High-Efficiency L-Band Kahn-Technique Transmitter," INT. MICROWAVE SYMPOSIUM, Baltimore, Md., Jun. 7–12, 1998.

A variation on the Kahn EER technique called "envelope tracking" allows the RF-power amplifier to be operated in its linear region with improved efficiency. It is useful when saturation of the RF-power amplifier causes undesired effects such as amplitude-to-phase conversion. The architecture is similar to that of FIG. 6 or 7 with the limiter removed. The gain of the class-S amplifier is set to produce a slightly higher supply voltage than is actually needed to support the current RF output. This can be done continuously (by increased gain or voltage offset) or in steps (as described in the paper by F. H. Raab entitled "Efficiency of envelope-tracking RF power-amplifier systems," Proc. RF EXPO EAST '86, Boston, Mass., pp. 303–311, Nov. 10–12, 1986) or continuously. There is no specific requirement for operation close to saturation; however, efficiency increases with proximity to saturation.

In many applications for full-carrier amplitude modulation, the output amplitude does not actually drop to zero. For complex modulations, however, the output envelope almost always goes through zero; hence, the transmitter for these signals must be capable of linear operation at all amplitudes from zero to peak output.

The conventional Kahn-technique transmitter shown in FIG. 7 employs a constant-amplitude driving signal derived from the hard-limited carrier. As a result, the power consumed by the driver is constant. When the transmitter is operating at peak output, the constant drive power causes only a small reduction in transmitter efficiency. At lower output power, however, the drive power is a much larger fraction of the transmitter power, resulting in a greatly reduced transmitter efficiency (see FIG. 8). This results in inefficient amplification of signals with large peak-to-average ratios.

A second disadvantage of constant-amplitude drive is a relatively large feed-through signal that appears as distortion in the transmitter output. The gate-drain (or base-collector) capacitance in the final amplifier couples some of the drive signal to the transmitter output. Since the drive signal is hard-limited, it has sidebands that cause intermodulation distortion (IMD) when coupled to the output.

Drive power can, in principle, be reduced by modulating the supply-voltage input to the driver amplifier. The same class-S modulator can be used as when both final and driver amplifiers operate from the same supply-voltage input. Such a Kahn-technique transmitter is shown in FIG. 9. Audio frequency input 70 is coupled to SSB modulator 71. The output of an SSB modulator is coupled to both envelope detector 72 and delay module 75. Envelope detector 72 is coupled to amplifier 73 having supply-voltage input 84. Amplifier 73 is coupled to first filter 74. First filter 74 is connected to the supply-voltage input of final amplifier 81 and the supply-voltage input of driver 80. Delay module 75 is coupled to limiter 76 which is coupled to second filter 79 through mixer 77. Frequency source (LO) 78 is also coupled to mixer 77. Second filter 79 is coupled to driver 80; driver 80 in turn is coupled to final amplifier 81. Final amplifier 81 is coupled to third filter 82 having an RF output 83. Amplifier 73 may be a class S amplifier and amplifiers 80 and 81 may be class D amplifiers. Filter 74 may be a low pass filter and filters 79 and 82 may be bandpass filters. Drive power varies in direct proportion to the output power, resulting in a constant transmitter efficiency at all output levels (see FIG. 8). The level of drive feed-through is reduced, and the unwanted sidebands of the drive signal are eliminated. This technique is known in the art, having been used with high-level modulation of AM transmitters with class-C RF power amplifiers, and having been taught by the inventor in seminars on high-efficiency power amplifiers, for example in a paper entitled "Envelope Elimination And Restoration And Related Feedback Systems," Research Note RN86-34 (Rev. B), Green Mountain Radio Research Company, Winooski, Vt., Dec. 8, 1987.

Unfortunately, the gain of virtually all RF-power devices (for example, transistors such as BJTs, MOSFETs, and GaAsFETs) decreases at lower signal levels. As a result, at the lower signal levels, the drive becomes insufficient to produce the desired output. This causes reduced output or no output, with attendant distortion of the signal. In this condition, the final amplifier no longer loads the class-S modulator (for example) as expected. The capacitors in the output filter of the class-S modulator fail to discharge, resulting in distortion of the final-amplifier modulating waveform. Similar effects can occur with modulators other than class-S modulators.

The resultant low-signal drop-out and distortion can be seen in the transfer curve of FIG. 10, the envelope waveforms of FIG. 11, and the output spectrum of FIG. 12, measured in an experimental transmitter.

DISCLOSURE OF INVENTION

Disclosed herein is a method and a circuit for high-efficiency linear RF-power amplification over a wide range of amplitudes from zero to peak output comprising a final RF power amplifier operating in or near saturation, an RF driver amplifier, a high-level amplitude modulator for modulating the final amplifier, means for modulating the driver amplifier, and means for controlling the supply-voltage input to the final amplifier and the amplitude of the drive.

The RF drive to the final amplifier is controlled so that it varies from a minimum level to peak as the desired transmitter output varies from zero to peak. Consequently, the power consumed by the driver is reduced in comparison to fixed drive, the final RF-power amplifier operates at all signal amplitudes, and the high-level amplitude modulator is given a constant load and operates properly at all signal amplitudes. As a further consequence, the transmitter is linear at all signal amplitudes, and efficiency is greatly improved at low signal amplitudes.

The limitations of conventional drive-modulation techniques are overcome in this invention by providing a minimum drive level under low- and no-signal conditions. This causes the final amplifier to continue to operate as a saturated or switching-mode RF amplifier, with a constant transfer characteristic between its supply-voltage input and the envelope of its RF output. It also provides a constant load impedance to the class-S modulator, allowing the class-S modulator to operate linearly at all output levels. These two factors result in linear amplitude modulation from zero to peak output. Various methods and apparatus for setting the minimum drive level are described below.

The minimum drive level depends upon the specific RF-power device and the required linearity. A simple method for setting the minimum drive level is to observe the envelope output (FIG. 10) for a minimum drive level of zero. The minimum drive level is then increased until the drop-out at low voltages disappears (FIG. 15). A second method uses plotted transfer curves. The minimum drive level is again increased from zero until the flat portion near zero disappears and the curve is adequately close to a straight line. A third method is to observe intermodulation products (FIG. 12) and to adjust the minimum drive level for the minimum level of intermodulation products (FIG. 16).

Thus, one aspect of the invention is a method for modulating a transmitter employing high-level amplitude modulation of an RF-power amplifier, in which the drive level of the RF-power amplifier is controlled such that a minimum drive level is always maintained to ensure proper operation and linear modulation of the RF-power amplifier. The RF-power amplifier is preferably operated in saturation or near saturation. The transmitter is preferably of the envelope-elimination-and-restoration type or the envelope-tracking type. Various structural embodiments of the invention operable in accordance with this method are described below.

In a first structural embodiment of the invention, a transmitter comprises means for modulating a driver amplifier by coupling the supply-voltage input of the driver amplifier to the output of a high-level amplitude modulator whose input is derived from an envelope detector and means for controlling the supply-voltage input to the final amplifier.

In a second structural embodiment of the invention, a transmitter comprises means for modulating a driver amplifier by coupling the supply-voltage input of the driver amplifier to the output of a high-level amplitude modulator which in turn is coupled to a circuit for summing a DC offset to provide a minimum drive level. A mixer is coupled to an envelope detector and means of controlling the supply-voltage input to the final amplifier.

In a third structural embodiment of the invention, a transmitter comprises means for varying the amplitude of the drive signal by coupling a circuit for summing a DC offset with a gain control coupled to an envelope detector. The output of the summing means is coupled to a gain control in the RF path ahead of the final amplifier. The supply-voltage of the final amplifier is controlled as in the previous two embodiments.

In a fourth structural embodiment of the invention, a transmitter comprises means for modulating a driver amplifier by coupling the supply-voltage input of the driver amplifier to the output of a high-level amplitude modulator which in turn is coupled to a drive level signal line from a digital signal processor (DSP) and digital-to-analog (D/A) converter and means of controlling the supply-voltage input to the final amplifier. This embodiment may have a baseband input or other input. The digital signal processor operates on the baseband or other input and the DSP and A/D circuit has two kinds of output: an analog or digital envelope output coupled to a first modulator, and a second analog or digital output coupled to a second modulator. The second analog or digital output includes both gain and DC-offset adjustments to the envelope.

It will be apparent to those skilled in the art that various features of these particular embodiments can be combined to form additional embodiments. For example, a hybrid of the third and fourth structural embodiments summarized above has a DSP controlling the gain of the RF path.

BRIEF DESCRIPTION OF DRAWINGS

The novel features believed characteristic of the invention are set forth in the appended claims. The invention itself however, as well as a preferred mode of use and further objects and advantages thereof, will best be understood by reference to the following detailed description of an illustrative embodiment when read in conjunction with the accompanying drawings, wherein:

BEST MODE FOR CARRYING OUT THE INVENTION

Figure 13:
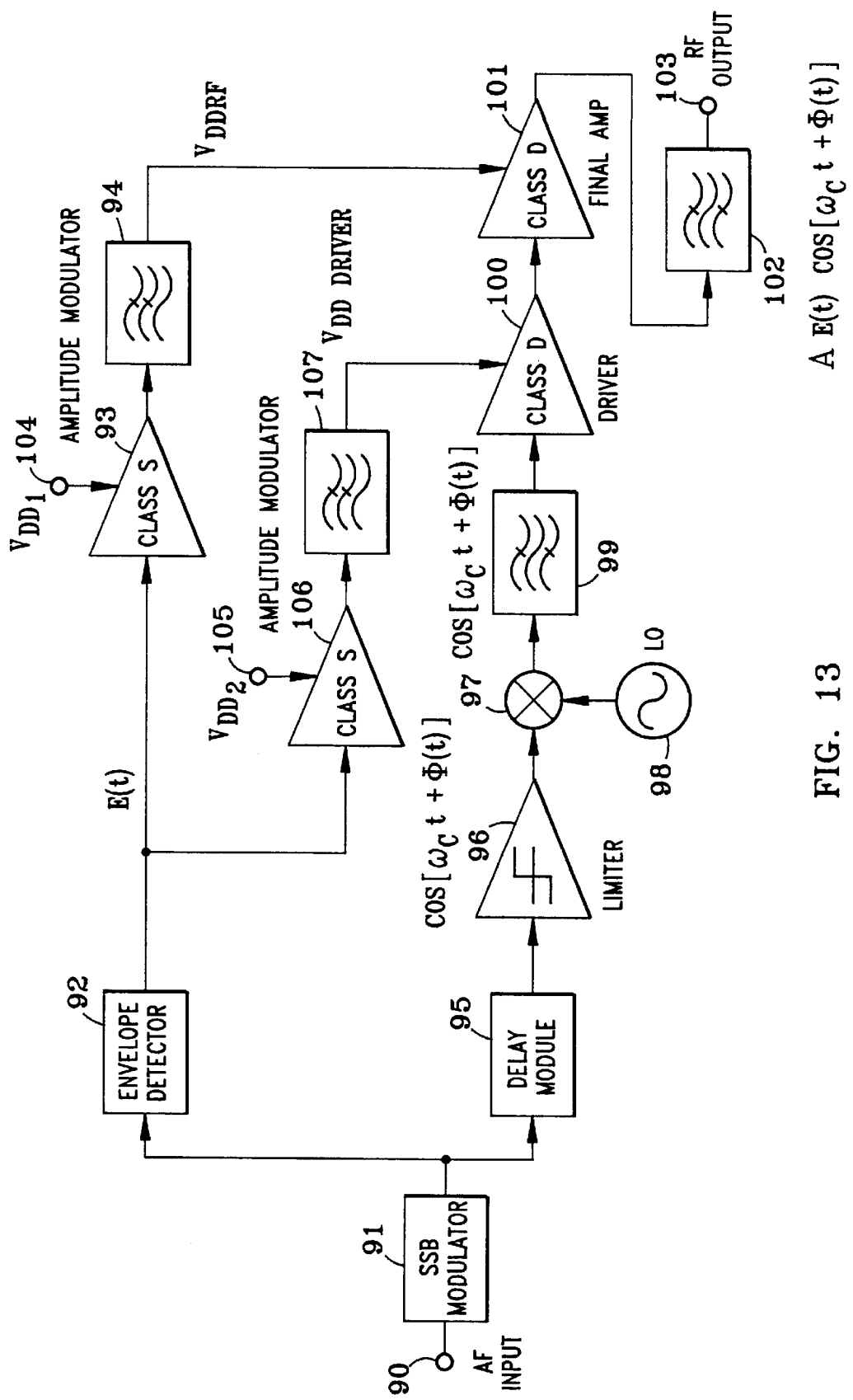
FIG. 13 is a schematic diagram illustrating a Kahn-technique transmitter with separate class-S modulators for the final and driver amplifiers according to a first embodiment of the present invention.

FIG. 13 shows a first embodiment of the invention, specifically showing means of controlling the drive level of a Kahn EER transmitter employing a second class-S modulator for full modulation of the driver. Audio frequency input 90 is coupled to SSB modulator 91. The output of SSB modulator 91 is coupled to both envelope detector 92 and delay module 95. (While FIG. 13 shows a SSB modulator, the signal input of the transmitter can be provided by any type of modulator producing an analog RF signal at the desired frequency of the RF output or at a suitable intermediate frequency.) Envelope detector 92 is coupled to first amplifier 93 having supply-voltage input 104, and first amplifier 93 is coupled to first filter 94, the output of which is connected to the supply-voltage input of final amplifier 101. Delay module 95 is coupled to limiter 96 which is coupled to second filter 99 through mixer 97. Frequency source (LO) 98 is also coupled to mixer 97. Second filter 99 is coupled to driver 100; driver 100 in turn is coupled to final amplifier 101. Final amplifier 101 is coupled to third filter 102 having an RF output 103. Full drive level control is accomplished by further coupling the output of envelope detector 92 to second amplifier 106 having supply-voltage input 105. Second amplifier 106 is in turn coupled to fourth filter 107, with the output of fourth filter 107 being coupled to the supply-voltage input of driver 100. Amplifiers 93 and 106 are amplitude modulators. Amplifiers 93 and 106 may be class S, G, pulse step or split band amplifiers, and amplifiers 100 and 101 may be any of class A–F amplifiers. (At higher frequencies, saturating class A or B amplifiers will be easier to implement than class C, D, E, or F amplifiers.) Filters 94 and 107 may be low pass filters and filters 99 and 102 may be bandpass filters. Even with full-drive modulation, the use of two separate modulators provides the benefit of operating driver 100 from a supply-voltage input chosen specifically for it. First supply-voltage input 104 which supplies final amplifier 101 may be tied to a 50-V (peak) supply and second supply-voltage input 105 which supplies the driver 100 may be tied to a 12-V (peak) supply. These supply voltages are illustrative examples only.

In a variation of the first two embodiments, the minimum drive level is set by adding a DC offset to the output of a class-S modulator. Driver 100 in FIG. 13 includes a DC power supply that provides a minimum supply voltage corresponding to the minimum drive level. When two separate class-S modulators are used as in FIG. 13, the voltage from class-S modulator 106 and filter 107 is then added to the internal offset voltage to obtain the desired total modulating voltage. If the driver and final amplifier are to be operated from similar supply voltages, modulator 105 and filter 107 are eliminated and the output from modulator 93 and filter 94 is added to the internal offset voltage in driver 100.

Figure 14:
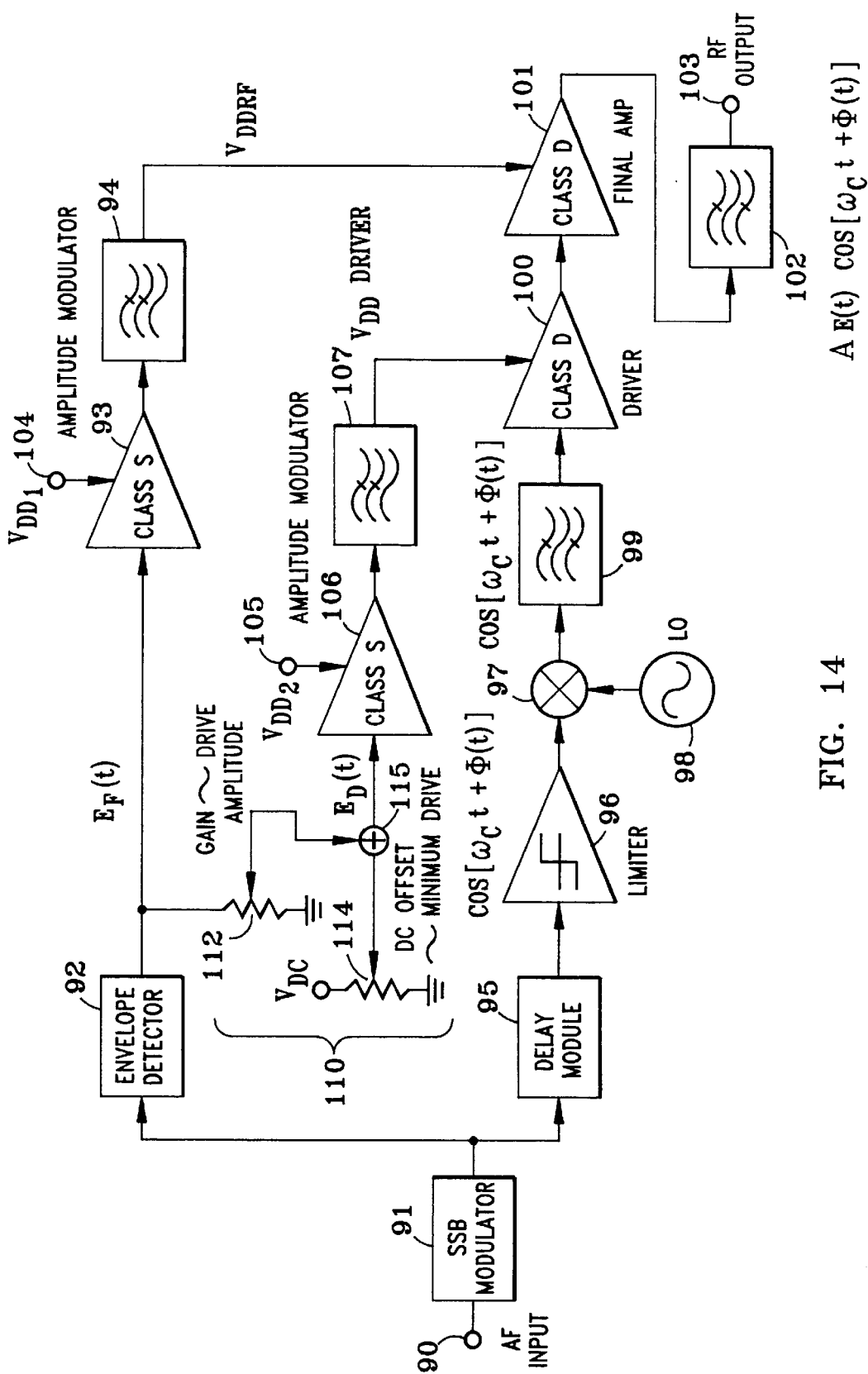
FIG. 14 is a schematic diagram illustrating a Kahn-technique transmitter with separate class-S modulators for the final and driver amplifiers and with additional circuitry to set a minimum drive level and to control the variation of the drive according to a second embodiment of the present invention.

FIG. 14 shows a second embodiment of the invention specifically describing the means of minimum drive level control in a Kahn EER transmitter comprising a second class-S modulator driven by an adjustable DC bias and a mixer circuit fed from the output of the envelope detector, coupled to the voltage supply of the driver. Audio frequency input 90 is coupled to SSB modulator 91. The output of SSB modulator 91 is coupled to both envelope detector 92 and delay module 95. Envelope detector 92 is coupled to first amplifier 93 having supply-voltage input 104. First amplifier 93 is coupled to first filter 94, the output of which is connected to the supply-voltage input of final amplifier 101. Delay module 95 is coupled to limiter 96 which is coupled to second filter 99 through mixer 97. Frequency source (LO) 98 is also coupled to mixer 97. Second filter 99 is coupled to driver 100; driver 100 in turn is coupled to final amplifier 101. Final amplifier 101 is coupled to third filter 102 having an RF output 103. Minimum drive level control is accomplished by also coupling the output of envelope detector 92 through summing circuit 110 (comprised of gain control 112 and DC offset control 114 and summing device 115 ), to second amplifier 106 having supply-voltage input 105. Second amplifier 106 is in turn coupled to fourth filter 107, the output of fourth filter 107 being connected to the supply-voltage input of driver 100. Amplifiers 93 and 106 may be class S, G, pulse step, or split band amplifiers and amplifiers 100 and 101 may be any of class A–F amplifiers. (Again, at higher frequencies, saturating class A or B amplifiers will be easier to implement than class C, D, E, or F amplifiers.) Filters 94 and 107 may be low pass filters and filters 99 and 102 may be bandpass filters. The DC offset bias sets the minimum drive level. The gain control is adjusted to cause the drive to go from the minimum level to peak level as the transmitter output goes from zero to peak output.

Figure 1:
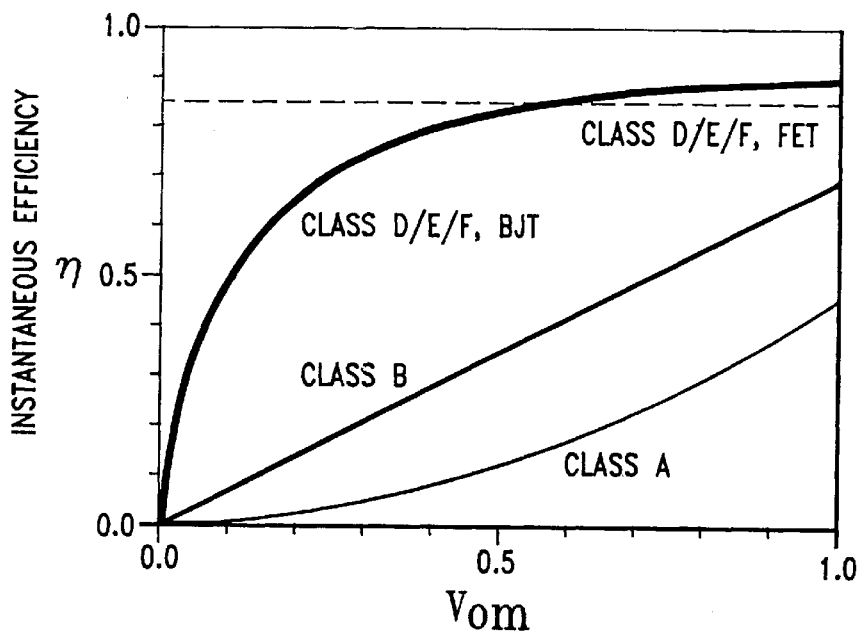
FIG. 1 illustrates the variation of the instantaneous efficiency of various conventional RF-power amplifiers with the amplitude (envelope) of their output voltage from zero to full output.
Figure 2:
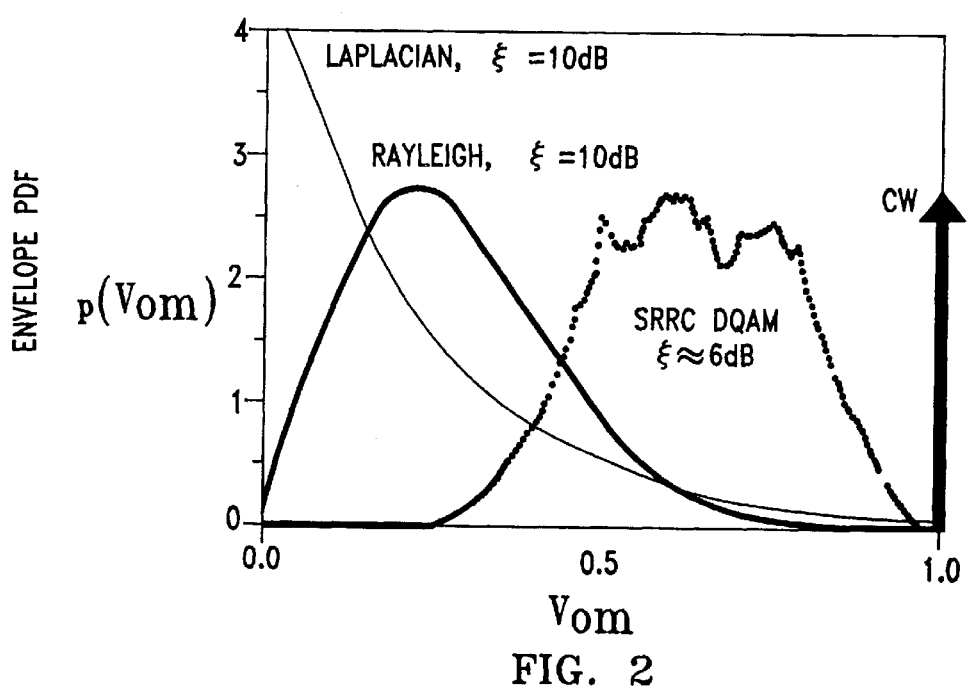
FIG. 2 illustrates probability-density functions for the envelopes of several signals encountered in modern radio communication.
Figure 3:
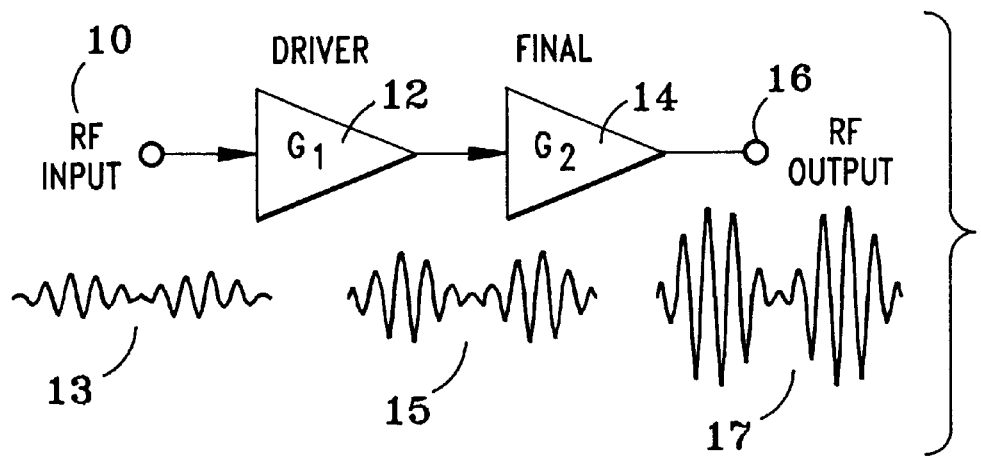
FIG. 3 is a schematic diagram of a conventional linear transmitter capable of amplifying any RF signal.
Figure 4:
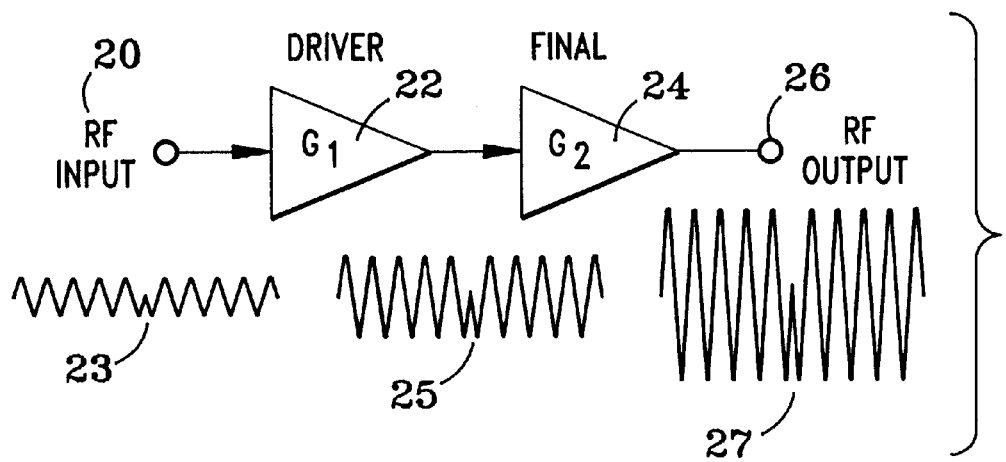
FIG. 4 is a schematic diagram of a conventional nonlinear transmitter offering high efficiency but limited to producing constant-envelope signals such as CW, FM, and PSK.
Figure 5:
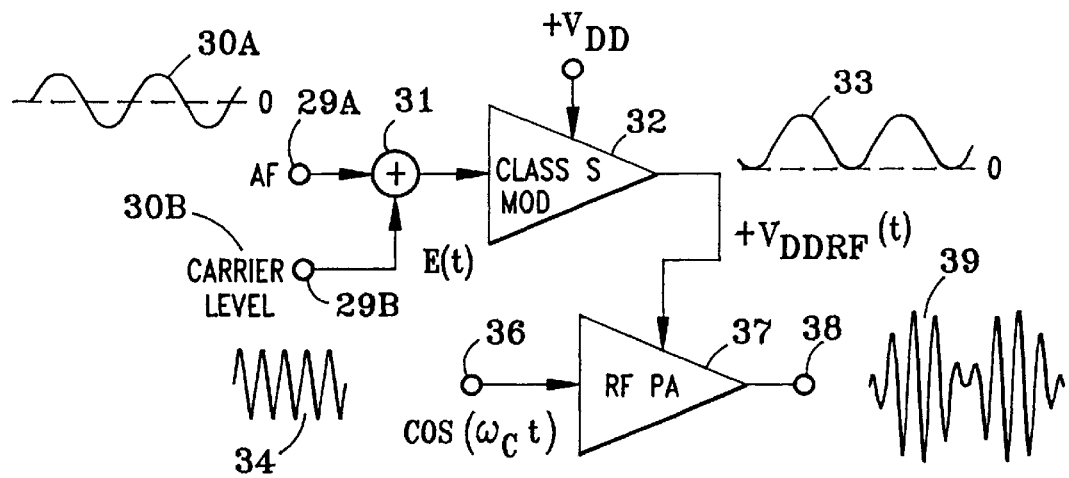
FIG. 5 is a schematic diagram of a conventional transmitter employing high-level amplitude modulation for the production of AM signals.
Figure 6:
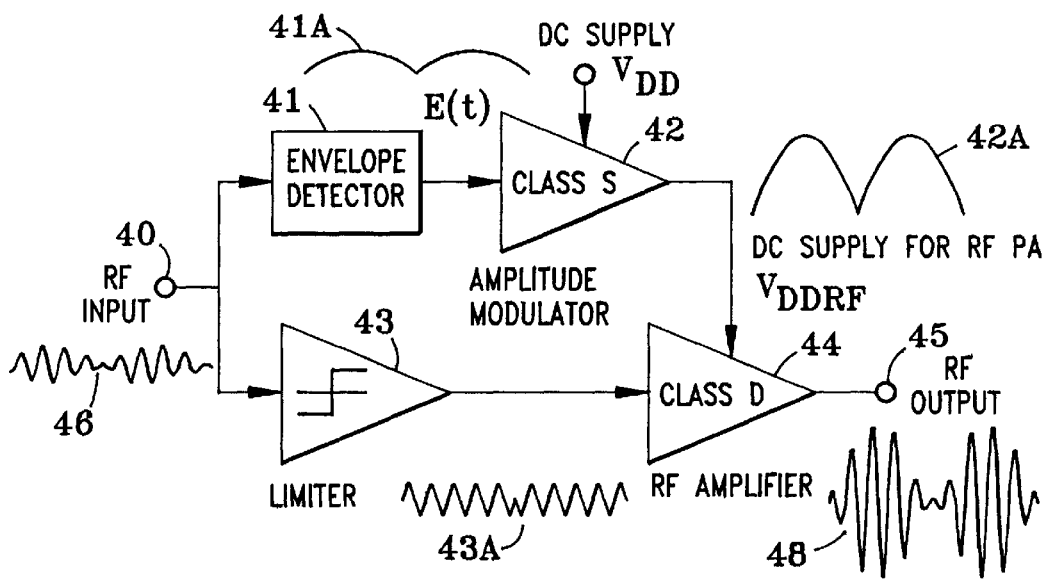
FIG. 6 is a schematic diagram of a conventional Kahn-technique transmitter that is capable of producing complex signals with both amplitude and phase modulations.
Figure 7:
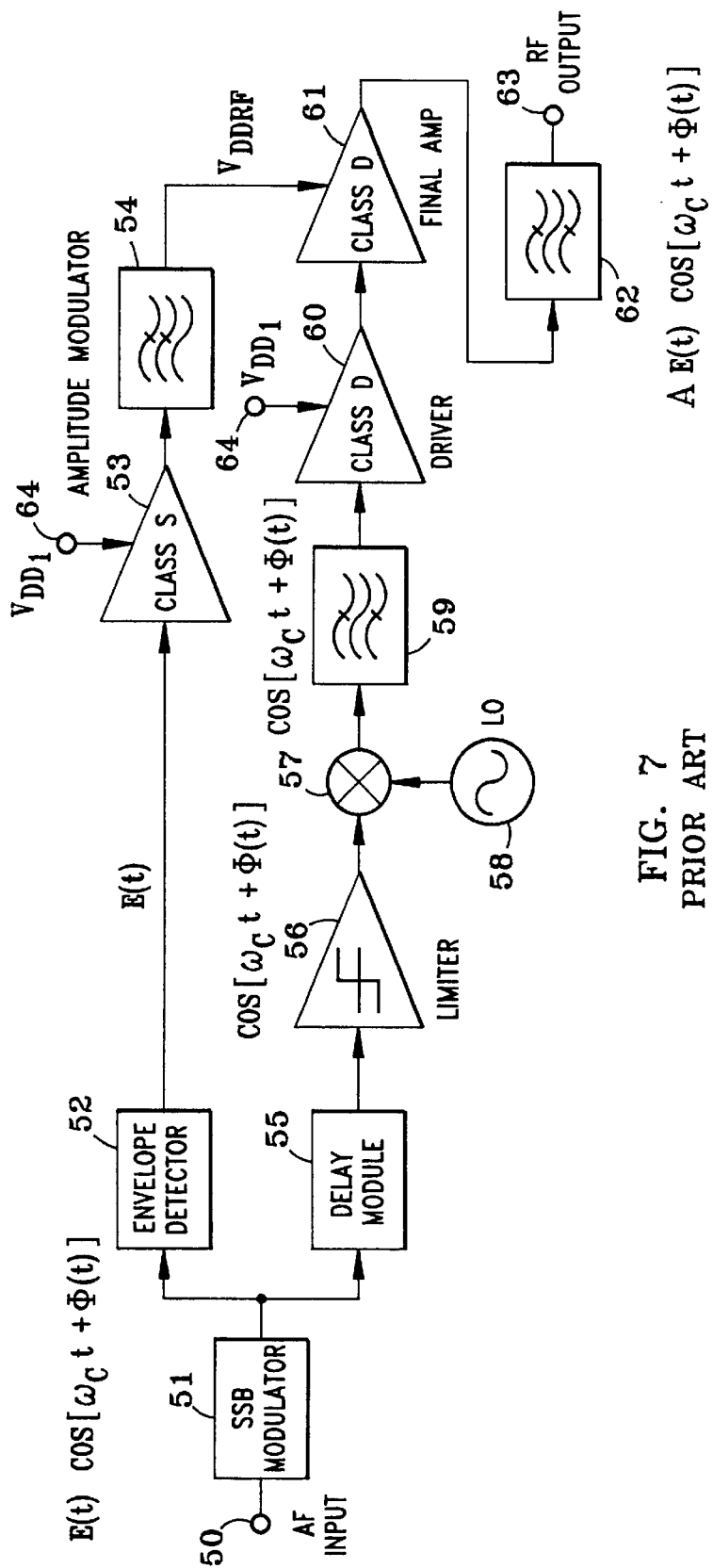
FIG. 7 is a schematic diagram of a conventional Kahn-technique transmitter that includes frequency translation and a conventional analog signal source.
Figure 8:
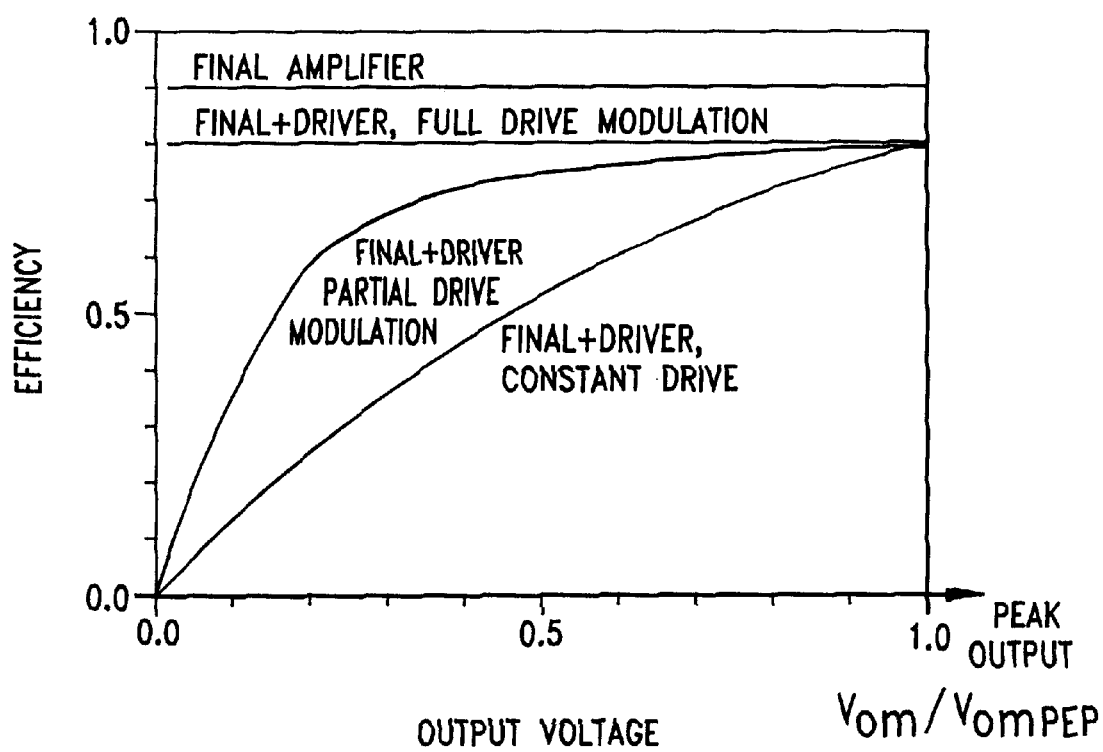
FIG. 8 illustrates the variation of the instantaneous transmitter efficiency with output-signal amplitude for several driving techniques, including that of the invention.
Figure 9:
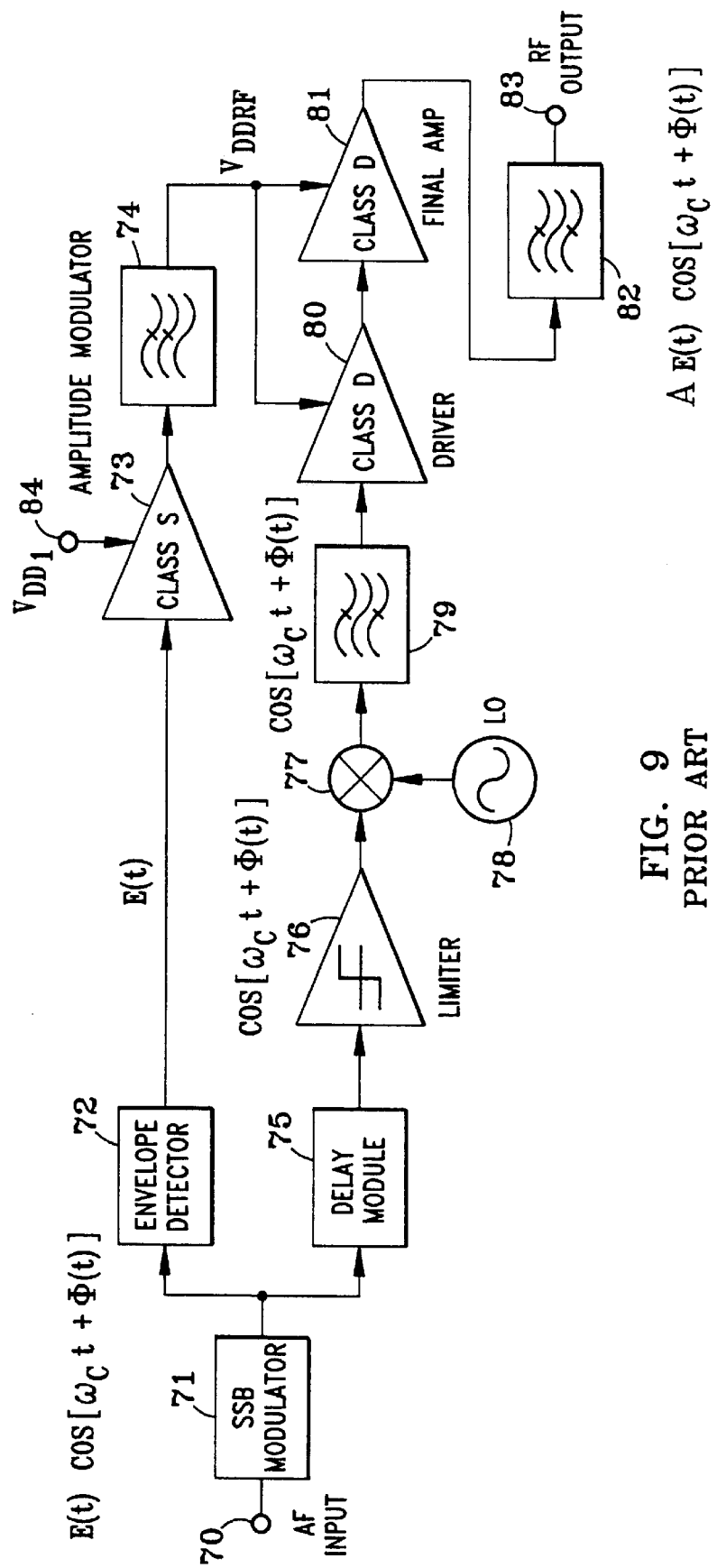
FIG. 9 is a schematic diagram of a modified Kahn-technique architecture with the final driver modulated by the same class-S modulator used to modulate the output.
Figure 10:
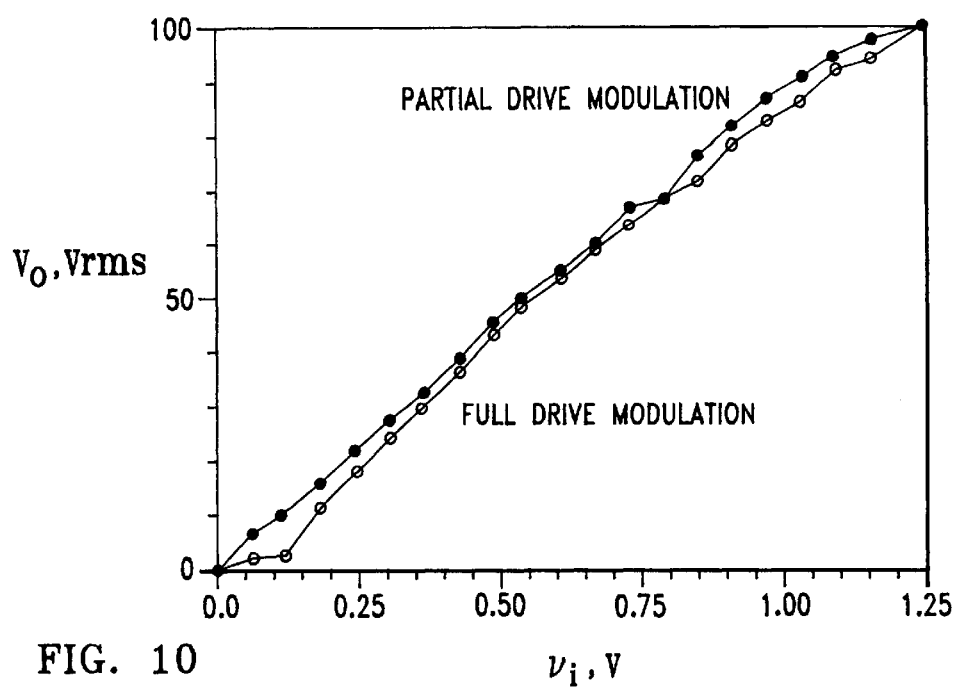
FIG. 10 illustrates the amplitude-modulation characteristics of transmitters with both conventional (full) drive modulation and the new (partial) drive-modulation technique, the latter performed in accordance with the invention.
Figure 11:
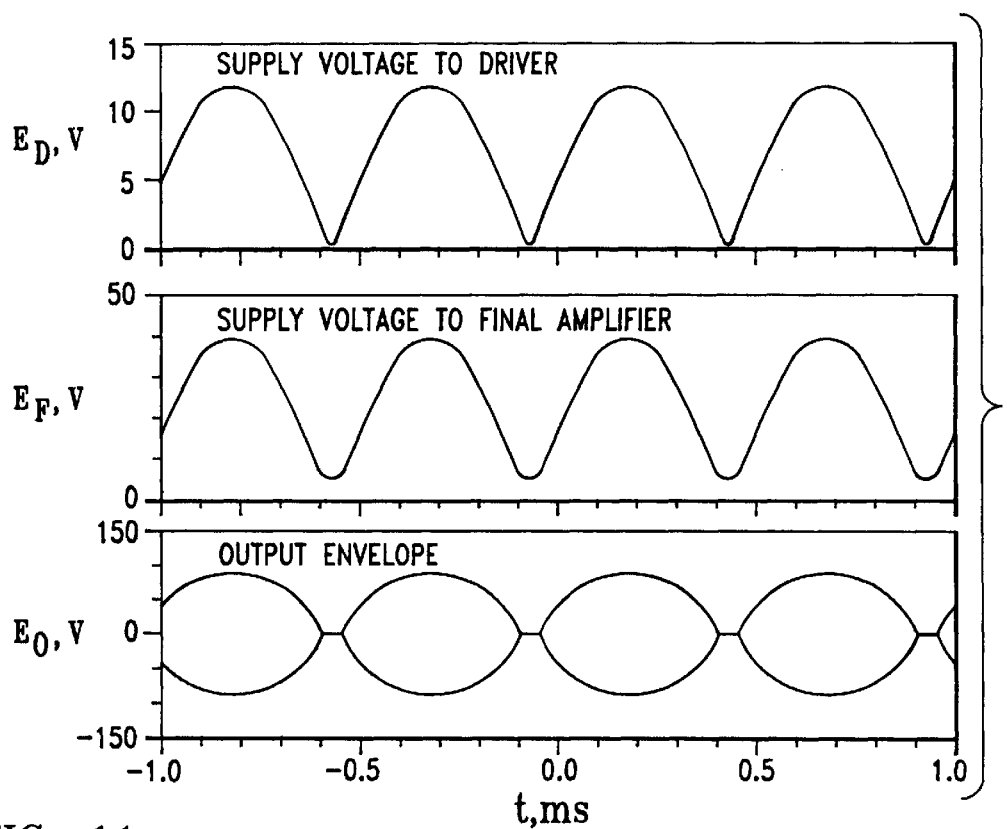
FIG. 11 illustrates the envelopes associated with conventional (full) drive modulation.
Figure 12:
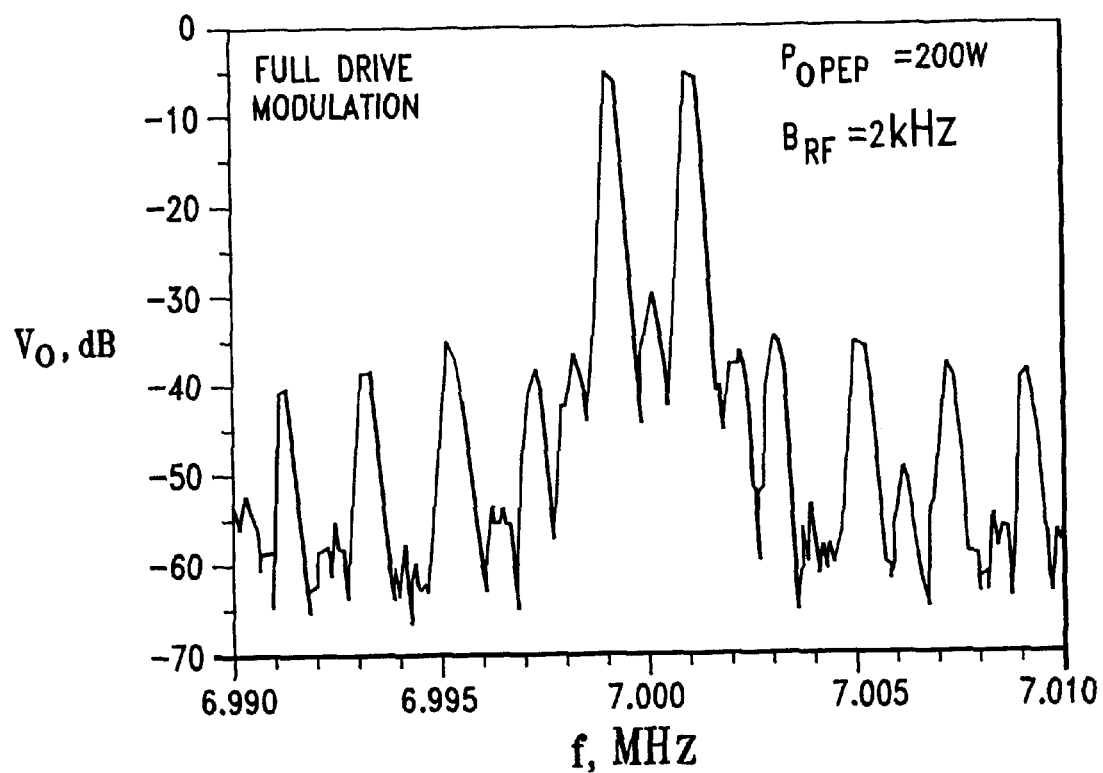
FIG. 12 illustrates the two-tone inter-modulation-distortion spectrum produced by conventional (full) drive modulation.
Figure 15:
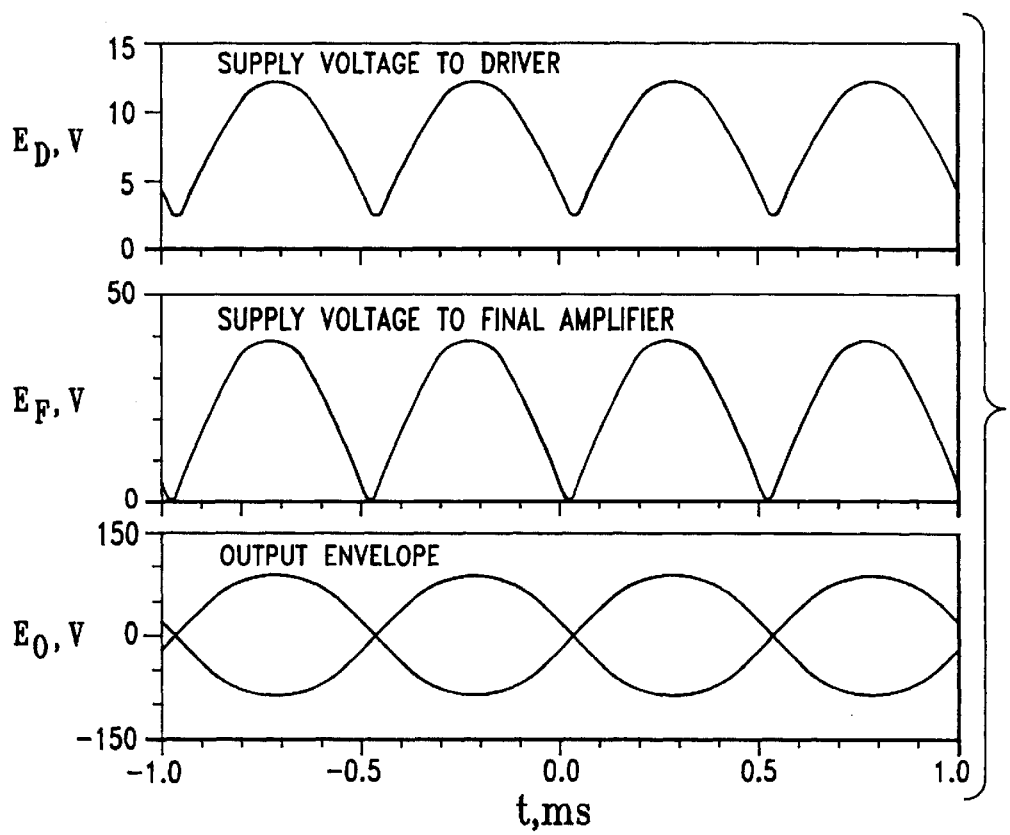
FIG. 15 illustrates measured envelope waveforms for a transmitter of the present invention.
Figure 16:
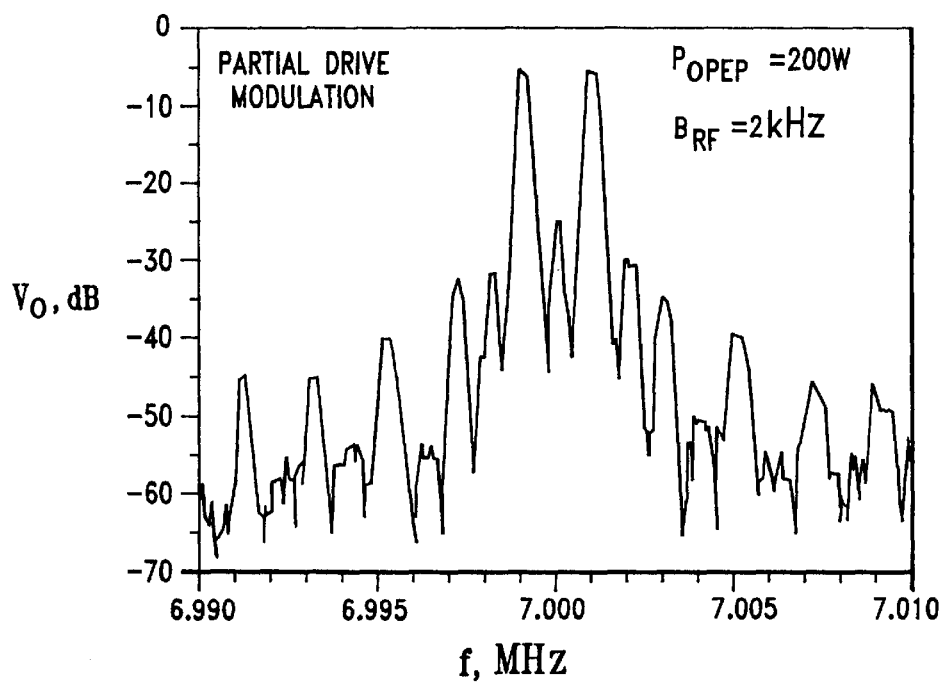
FIG. 16 illustrates the measured IMD spectrum resulting from the present invention.

Partial drive modulation as described above maintains high efficiency over a large dynamic range, as shown in FIG. 8. It provides efficiency superior to that of fixed drive at all output levels. The improvement in linearity can be seen in the measured transfer curve of FIG. 10, envelope waveforms shown in FIG. 15, and output spectrum shown in FIG. 16.

Conventionally, drivers can consist of multiple stages, with the earlier stage(s) being sometimes called "predriver (s)." The techniques of the present invention can be extended to include modulation of the predrivers, or of oscillators and other sources of power consumption that are normally fixed (un-modulated).

A variety of different high-level modulators can be employed, including class S, class G, class B, and pulse-step. It is not necessary for both modulators to be of the same type. For example, a class-S or pulse-step modulator might be used for the high-power final amplifier to obtain the maximum efficiency, but a class-B or class-G modulator could be used for the driver where efficiency is less critical.

Figure 17:
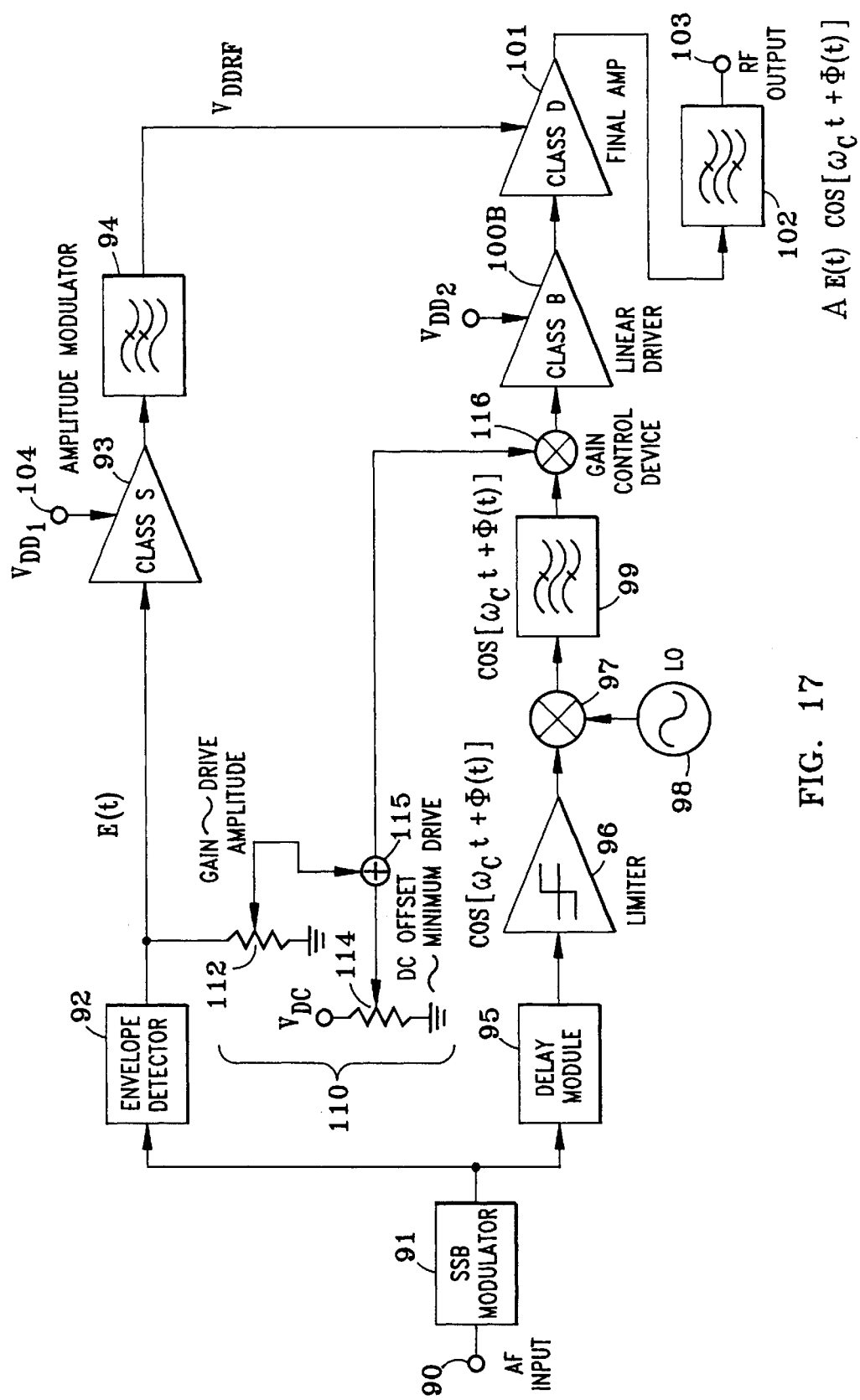
FIG. 17 is a schematic diagram of a Kahn-technique transmitter with an attenuator or other variable-gain device to control the drive amplitude according to a third embodiment of the present invention.

FIG. 17 shows a third embodiment of the invention specifically describing the means of controlling the drive level of a Kahn EER transmitter, employing a variable attenuator (e.g., pin diode) or other gain-control device 116 (e.g., dual-gate MOSFET) located between the second filter and driver, and fed thru an adjustable DC bias and having the output of an envelope detector coupled to a gain control circuit. Audio frequency input 90 is coupled to SSB modulator 91. The output of SSB modulator is coupled to both envelope detector 92 and delay module 95. Envelope detector 92 is coupled to first amplifier 93 having supply-voltage input 104, and first amplifier 93 is coupled to first filter 94, the output of which is connected to the supply-voltage input of final amplifier 101. Delay module 95 is coupled to limiter 96 which is coupled to second filter 99 through mixer 97. Frequency source 98 is also coupled to mixer 97 . Second filter 99 is coupled to second gain control device 116 which in turn is coupled to driver 100B; driver 100B in turn is coupled to final amplifier 101. Final amplifier 101 is coupled to third filter 102 having an RF output 103. Minimum drive level control is accomplished by also coupling the output of envelope detector 92 through summing circuit 110 (comprised of gain control 112, DC offset control 114, and summing device 115 ), to second gain control device 116. Amplifier 93 may be a class S, G, pulse step, or split band amplifier. Amplifier 100B can be any linear amplifier, class A, B, or F and amplifier 101 may be any saturated or nearly saturated amplifier of classes A–F. Filter 94 may be a low pass filter and filters 99 and 102 may be bandpass filters. The DC offset bias sets the minimum drive level.

Optionally, gate-bias modulation may be used for gain control in place of the gain-control circuit shown in FIG. 17.

For example, an FET device could be used as a gain-control device 116. The function of gain-control device 116 could also be integrated into amplifier 100B through gate-bias modulation.

Figure 18:
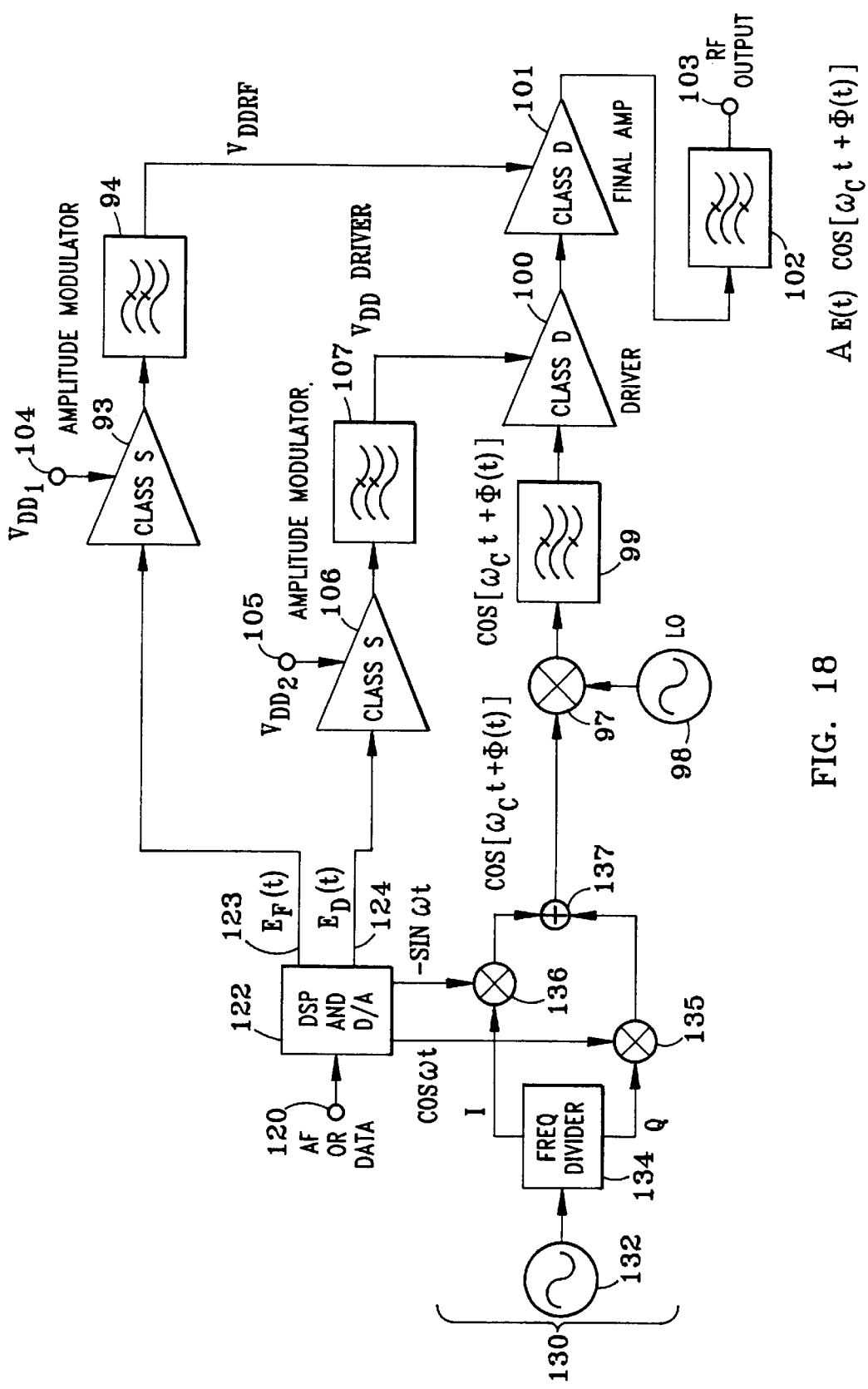
FIG. 18 is a schematic diagram of a Kahn-technique transmitter with digital signal processing for controlling the drive level according to a fourth embodiment of the present invention.

FIG. 18 is a schematic diagram of a Kahn-technique transmitter with digital signal processing for controlling the drive level according to a fourth embodiment of the present invention. In this fourth embodiment, a Digital Signal Processor (DSP) is used to determine the desired drive level (as well as signal phase and amplitude). The DSP, in combination with digital-to-analog (D/A) converters and a quadrature modulator, directly synthesizes the phase-modulated carrier, the envelope of the final amplifier, and the envelope function with minimum level of the driver. Gate-bias modulation of a driver or predriver stage can also be used to control drive level. As mentioned above, this embodiment may have a baseband input or other input. The digital signal processor operates on the baseband or other input and the DSP and A/D circuit has two kinds of output: an analog or digital envelope output coupled to a first modulator, and a second analog or digital output coupled to a second modulator. The second analog or digital output includes both gain and DC-offset adjustments to the envelope.

As shown in FIG. 18, baseband audio frequency or data input 120 is coupled to DSP and D/A converter 122. DSP and D/A converter 122 is coupled to quadrature modulator circuit 130. Data signal line 123 from DSP and D/A converter 122 is coupled to first amplifier 93 having supply-voltage input 104, and first amplifier 93 is coupled to first filter 94, the output of which is connected to the supply-voltage input of final amplifier 101. Drive level signal line 124 from DSP and D/A converter 122 is coupled to second amplifier 106 having supply-voltage input 105, and second amplifier 106 is coupled to fourth filter 107, the output of which is coupled to the supply-voltage input of driver 100. Quadrature modulator circuit 130 is coupled to mixer 97. Frequency source (LO) 98 is also coupled to mixer 97. Mixer 97 is coupled to second filter 99, which in turn is coupled to driver 100, and driver 100 in turn is coupled to final amplifier 101. Final amplifier 101 is coupled to third filter 102 having an RF output 103. Amplifiers 93 and 106 may be class S, G, pulse step, or split band amplifiers, and amplifiers 100 and 101 may be any of class A–F amplifiers. Filters 94 and 107 may be low pass filters and filters 99 and 102 may be bandpass filters.

Quadrature modulator circuit 130 is optional in that it may be eliminated by using a suitably high-speed DSP and suitably high-speed D/A converter, which can generate the waveform directly. Thus, a simpler embodiment omitting quadrature modulator circuit 130 may be used in some applications.

The descriptions of these embodiments include a number of elements whose inclusion is optional, depending upon the application. These elements include the limiter 96, local oscillator 98 and mixer 97 (for frequency translation), bandpass filters 99 after the mixers, and low-pass filter 94 after the high-level modulator. For example, class-G and pulse-step modulators do not require output filters, and the split-band modulator uses its own unique output filter/combiner.

The new drive-modulation technique described herein can, of course, also be used in combination with other techniques for saving power and improving linearity in radio transmitters, including microwave transmitters. These techniques include, but are not limited to controlled carrier, envelope feedback, phase-lock, polar feedback (envelope and phase), Cartesian feedback (I and Q components), and predistortion.

INDUSTRIAL APPLICABILITY

The applications of the invention include not only radio broadcasting and radio communication, but also induction heating, magnetic-resonance imaging, industrial-scientific-medical (ISM) applications, and other uses of powerful RF signals. The invention provides methods and apparatus for high-efficiency linear RF-power amplification over a wide range of amplitudes from zero to peak output. The power consumed by the driver is reduced in comparison to fixed drive, while the final RF-power amplifier operates at all signal amplitudes, and the high-level amplitude modulator is given a constant load, while operating properly at all signal amplitudes. Furthermore, the transmitter is linear at all signal amplitudes and efficiency is greatly improved at low signal amplitudes. The subject invention can also be applied to envelope-tracking systems (as described above) wherein the RF-power amplifier is operated in the linear region.

The description of the embodiments of the present invention is given above for the understanding of the present invention. It will be understood that the invention is not limited to the particular embodiments described herein. The invention is capable of various modifications, rearrangements, and substitutions that will now become apparent to those skilled in the art. For example, several of the functional elements illustrated in the schematics may be combined in integrated-circuit implementations performing the same functions, and the improvements provided by the present invention can be combined with other techniques, including those noted above such as controlled-carrier techniques, envelope feedback techniques, phase-lock techniques, polar feedback (envelope and phase), Cartesian feedback (I and Q components), and predistortion. Various types of RF-power amplifier (class A, B, C, D, E, or F) and high-level amplitude modulator (class S, class G, split-band, or pulse-step modulator) can be used to implement the technique. Hybrid combinations of the different amplifiers and modulators (for example, the so-called "class-H" amplifier) can also be used. Amplifiers and modulators can be implemented using any type of power device including bipolar transistors, MOSFETs, JFETs, MESFETs, HBTs, HEMTs, HFETS, thyristors, and vacuum-tubes, for example.

What is claimed is:

1. A transmitter, comprising:
   a) a first amplifier, said first amplifier having a signal input, a first supply-voltage input, and a first amplifier output;
   b) a driver having a second supply-voltage input and a driver output; and
   c) a final amplifier having a final amplifier input coupled to said driver output, said final amplifier having a drive level, an RF output, and a third supply-voltage input, and said first amplifier being coupled to said third supply-voltage input of said final amplifier for modulating said final amplifier, said transmitter being characterized in that:
   said first amplifier is also coupled to said second supply-voltage input of said driver for modulating said driver, whereby said first amplifier performs as a first modulator and said transmitter being further characterized in that said drive level of said final amplifier is controlled by a DC offset voltage applied to said driver for setting said minimum drive level for ensuring linear modulation of said final amplifier.

2. A transmitter as recited in claim 1, wherein said transmitter is of the envelope-elimination-and-restoration type.

3. A transmitter as recited in claim 1, wherein said transmitter is of the envelope-tracking type.

4. A transmitter as recited in claim 1, further comprising a first filter for filtering said first amplifier output.

5. A transmitter as recited in claim 1, further comprising a second filter for filtering said final amplifier output.

6. A transmitter as in claim 1, wherein said first amplifier comprises an amplifier selected from the group consisting of Class S, Class G, pulse step, and split band amplifiers, and combinations thereof.

7. A transmitter as in claim 1, wherein said final amplifier comprises an amplifier selected from the group consisting of Class A, Class B, Class C, Class D, Class E, and Class F amplifiers, and combinations thereof.

8. A transmitter comprising:
   a) a first modulator, said first modulator having a first signal input, a first supply-voltage input, and a first modulator output;
   b) a second modulator separate from said first modulator, said second modulator having a second signal input, a second supply-voltage input, and a second modulator output;
   c) a driver having a third supply-voltage input and a driver output, said second modulator output being coupled to said third supply-voltage input of said driver for modulating said driver; and
   d) a final amplifier having a final amplifier input coupled to said driver output, said final amplifier having a drive level, an RF output, and a fourth supply-voltage input, said first modulator output being coupled to said fourth supply-voltage input of said final amplifier for modulating said final amplifier.

9. A transmitter as recited in claim 8, wherein said transmitter is of the envelope-elimination-and-restoration type.

10. A transmitter as recited in claim 8, wherein said transmitter is of the envelope-tracking type.

11. A transmitter as recited in claim 8, said final amplifier having a drive level, wherein said drive level of said final amplifier is controlled to maintain a minimum drive level for ensuring linear modulation of said final amplifier.

12. A transmitter as recited in claim 8, further comprising a first filter for filtering said first modulator output.

13. A transmitter as recited in claim 8, further comprising a second filter for filtering said final amplifier output.

14. A transmitter as recited in claim 8, further comprising a third filter for filtering said second modulator output.

15. A transmitter as in claim 8 wherein said first modulator comprises an amplifier selected from the group consisting of Class S, Class G, pulse step, and split band amplifiers, and combinations thereof.

16. A transmitter as in claim 8 wherein said second modulator comprises an amplifier selected from the group consisting of Class S, Class G, pulse step, and split band amplifiers, and combinations thereof.

17. A transmitter as in claim 8, further comprising an envelope detector whose envelope output is coupled to said signal input of said first modulator.

18. A transmitter as in claim 17 further comprising a summing circuit coupled between said envelope detector and said driver.

19. A transmitter as in claim 18, wherein said summing circuit comprises:
   i) a variable gain control device;
   ii) a summing device, said variable gain control device being coupled between said envelope detector and said summing device; and
   iii) a variable DC bias control device coupled to said summing device for controlling said drive level of said final amplifier to maintain a minimum drive level for ensuring linear modulation of said final amplifier.

20. A transmitter having a signal input, said transmitter comprising:
- a) an envelope detector for forming an envelope signal;
- b) a delay module, said signal input being coupled to both said envelope detector and said delay module;
- c) a limiter coupled to said delay module;
- d) a first modulator, said first modulator having a first supply-voltage input and a first modulator output;
- e) a second modulator separate from said first modulator, said second modulator having a second supply-voltage input and a second modulator output, said envelope detector being coupled to both said first and second modulators;
- f) a local oscillator and a mixer coupled to said limiter for providing a delayed phase-modulated signal;
- g) a driver accepting said delayed phase-modulated signal, said driver having a third supply-voltage input and a driver output, said second modulator output being coupled to said third supply-voltage input of said driver for modulating said driver; and
- h) a final amplifier having a final amplifier input coupled to said driver output, said final amplifier having a drive level, an RF output, and a fourth supply-voltage input, said first modulator output being coupled to said fourth supply-voltage input of said final amplifier for modulating said final amplifier.

21. A transmitter as recited in claim 20, wherein said signal input of said transmitter is provided by a modulator producing an analog RF signal at the desired frequency of said RF output of said final amplifier or at a suitable intermediate frequency.

22. A transmitter as recited in claim 20, wherein said drive level of said final amplifier is controlled to maintain a minimum drive level for ensuring linear modulation of said final amplifier.

23. A transmitter as in claim 20 further comprising a summing circuit coupled between said envelope detector and said driver.

24. A transmitter as in claim 23, wherein said summing circuit comprises:
- i) a variable gain control device;
- ii) a summing device, said variable gain control device being coupled between said envelope detector and said summing device; and
- iii) a variable DC bias control device coupled to said summing device for controlling said drive level of said final amplifier to maintain a minimum drive level for ensuring linear modulation of said final amplifier.

25. A transmitter having an RF signal input, said transmitter comprising:
- a) a modulator, said modulator having an envelope signal input, a first supply-voltage input, and a modulator output;
- b) a driver having a driver input, a second supply-voltage input, and a driver output;
- c) an envelope detector operating on said signal input of said transmitter and whose envelope output is coupled to said envelope signal input of said modulator;
- d) a final amplifier having a final amplifier input coupled to said driver output, said final amplifier having a drive level, an RF output, and a third supply-voltage input, said modulator output being coupled to said third supply-voltage input of said final amplifier for modulating said final amplifier; and
- e) a first variable gain control device operating on said RF signal input and coupled to said driver input.

26. A transmitter as recited in claim 25, further comprising:
- f) a delay module operating on said signal input of said transmitter;
- g) a limiter coupled to said delay module; and
- h) a local oscillator and a mixer coupled to said limiter for providing a delayed phase-modulated signal.

27. A transmitter as recited in claim 25, further comprising a summing circuit coupled between said envelope detector and said first variable gain control device.

28. A transmitter as recited in claim 27, wherein said summing circuit comprises:
- i) a second variable gain control device;
- ii) a summing device, said second variable gain control device being coupled between said envelope detector and said summing device; and
- iii) a variable DC bias control device coupled to said summing device for controlling said drive level of said final amplifier to maintain a minimum drive level for ensuring linear modulation of said final amplifier.

29. A transmitter as recited in claim 25, wherein said RF signal input of said transmitter is provided by a modulator producing an analog RF signal at the desired frequency of said RF output of said final amplifier or at a suitable intermediate frequency.

30. A transmitter having a baseband or other input, comprising:
- a) a first modulator, said first modulator having a first signal input, a first supply-voltage input, and a first modulator output;
- b) a second modulator separate from said first modulator, said second modulator having a second signal input, a second supply-voltage input, and a second modulator output;
- c) a driver having a third supply-voltage input and a driver output, said second modulator output being coupled to said third supply-voltage input of said driver for modulating said driver;
- d) a digital signal processor and digital-to-analog converter circuit, said digital signal processor operating on said baseband or other input of the transmitter and said circuit having a first analog or digital envelope output coupled to said first modulator, and a second analog or digital output coupled to said second modulator, said second analog or digital output including both gain and DC-offset adjustments to said envelope; and
- e) a final amplifier having a final amplifier input coupled to said driver output, said final amplifier having a drive level, an RF output, and a fourth supply-voltage input, said first modulator output being coupled to said fourth supply-voltage input of said final amplifier for modulating said final amplifier.

31. A transmitter as in claim 30, further comprising: a quadrature modulator circuit coupled between said digital signal processor and digital-to-analog converter circuit and said driver.

32. A transmitter as in claim 30, further comprising:
- i) a quadrature modulator circuit;
- ii) a frequency source; and
- iii) a mixer, said quadrature modulator circuit being coupled between said digital signal processor and digital-to-analog converter circuit and said mixer; said frequency source being coupled to said mixer, and said mixer being coupled to said driver input.

* * * * *